US008647897B2

(12) United States Patent
Weil et al.

(10) Patent No.: US 8,647,897 B2
(45) Date of Patent: Feb. 11, 2014

(54) AIR-STABLE INK FOR SCALABLE, HIGH-THROUGHPUT LAYER DEPOSITION

(75) Inventors: Benjamin D. Weil, Del Mar, CA (US); Stephen T. Connor, Stanford, CA (US); Yi Cui, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 13/426,307

(22) Filed: Mar. 21, 2012

(65) Prior Publication Data

US 2012/0244650 A1    Sep. 27, 2012

Related U.S. Application Data

(60) Provisional application No. 61/454,793, filed on Mar. 21, 2011.

(51) Int. Cl.
*H01L 21/00* (2006.01)
*B05D 3/02* (2006.01)

(52) U.S. Cl.
USPC ..... 438/22; 438/98; 427/372.2; 257/E31.002; 257/E33.002

(58) Field of Classification Search
USPC ............... 438/22, 98; 257/E31.002, E33.002; 427/372.2
See application file for complete search history.

(56) References Cited

U.S. PATENT DOCUMENTS

| | | | |
|---|---|---|---|
| 6,414,146 B1 * | 7/2002 | Takeyama et al. | 544/221 |
| 7,663,057 B2 | 2/2010 | Yu et al. | |
| 8,026,124 B2 | 9/2011 | Chuang | |
| 8,048,477 B2 | 11/2011 | Van Duren et al. | |
| 8,303,699 B2 * | 11/2012 | Chretien et al. | 106/31.28 |
| 2011/0287573 A1 | 11/2011 | Johnson et al. | |
| 2012/0055554 A1 * | 3/2012 | Radu et al. | 136/264 |

OTHER PUBLICATIONS

Inventors: Chen G., Wang L., Yang D.; "Preparing indium nanoparticles ink, useful for preparing sulfur-indium-copper membrane, comprises obtaining a solution of indium chloride, polyalcohol and stabilizer in a container, and adding a reducing agent solution into first solution"; Thomson Reuters 2013 copyright; Derwent 2010-Q09918, p. 1-4.*

Weil et al., "CuInS2 Solar Cells by Air-Stable Ink Rolling", "Journal of American Chemical Society Communications", 2010, pp. 6642-6643, vol. 132, No. 19, Publisher: American Chemical Society, Published in: US.

* cited by examiner

*Primary Examiner* — Michelle Mandala
(74) *Attorney, Agent, or Firm* — Kaplan Breyer Schwarz & Ottesen, LLP

(57) ABSTRACT

A method for producing and depositing air-stable, easily decomposable, vulcanized ink on any of a wide range of substrates is disclosed. The ink enables high-volume production of optoelectronic and/or electronic devices using scalable production methods, such as roll-to-roll transfer, fast rolling processes, and the like.

26 Claims, 7 Drawing Sheets

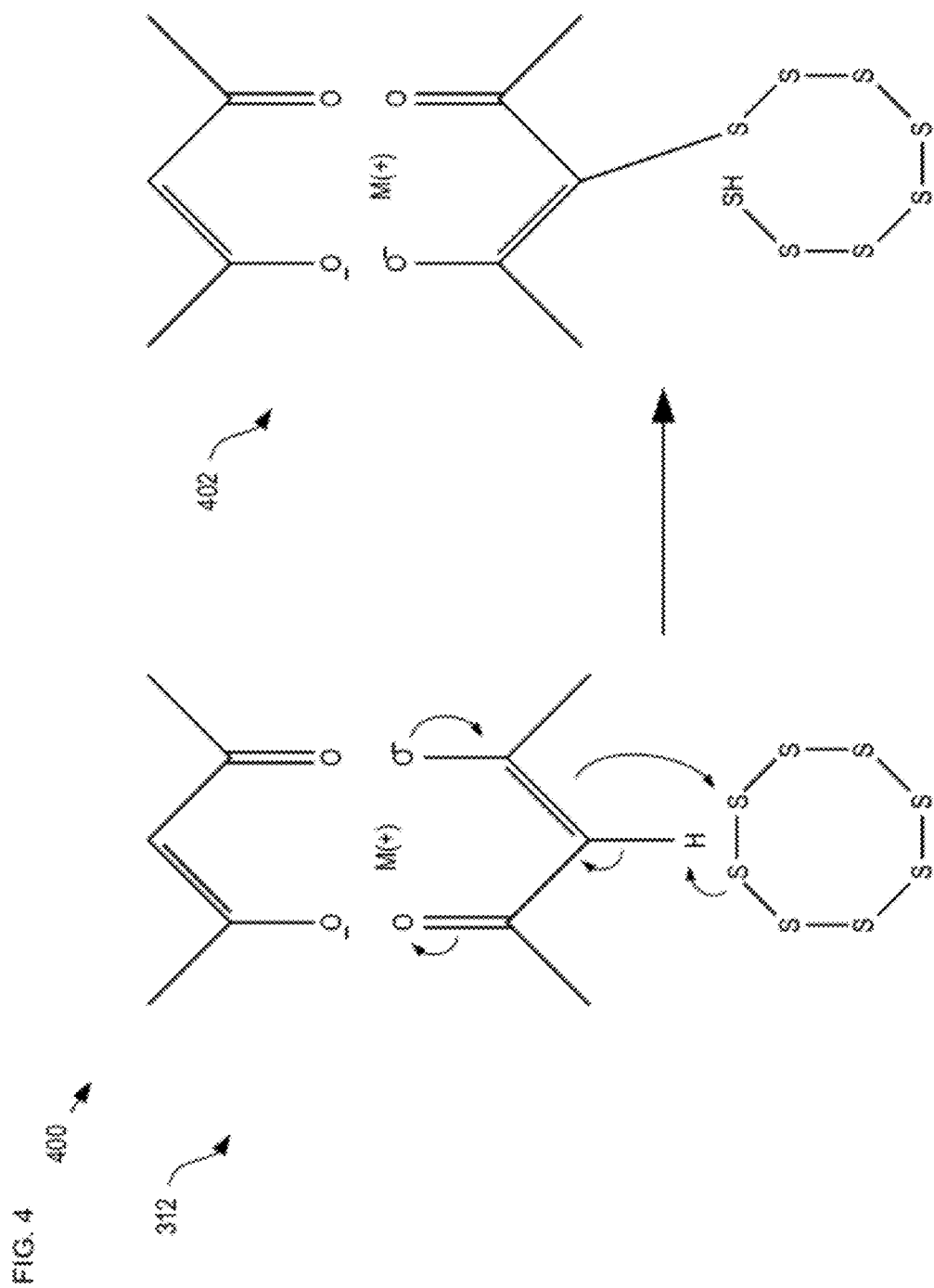

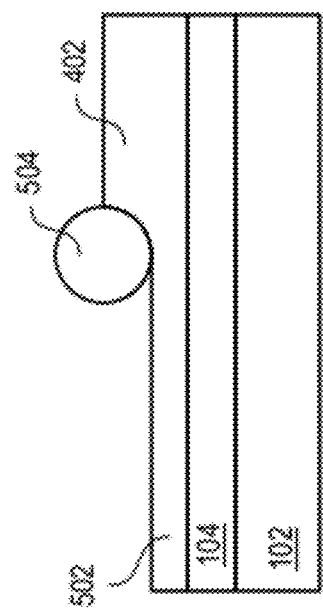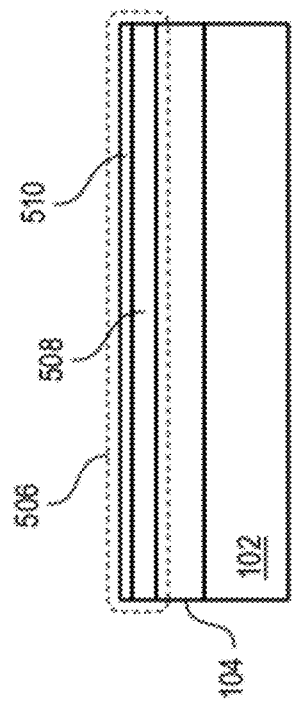
FIG. 5A
FIG. 5B

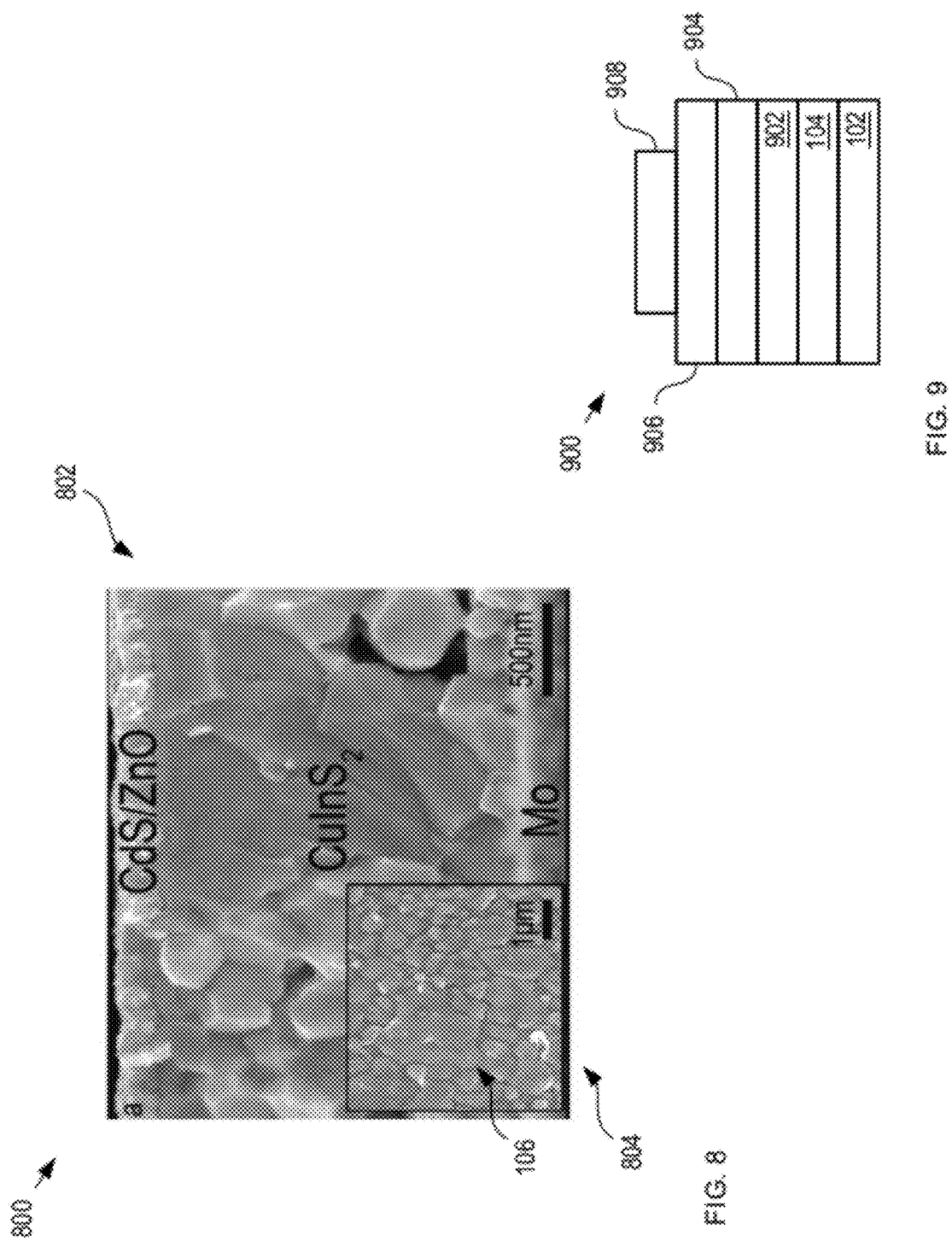

AIR-STABLE INK FOR SCALABLE, HIGH-THROUGHPUT LAYER DEPOSITION

CROSS-REFERENCE TO RELATED APPLICATION

This application claims the benefit of U.S. Provisional Application Ser. No. 61/454,793, filed Mar. 21, 2011, entitled "Air-stable Ink Suitable for Development of Optoelectronic Devices," which is incorporated by reference.

STATEMENT REGARDING FEDERALLY SPONSORED RESEARCH

This invention was made with Government support under DE-FG36-08GO18005 awarded by the U.S. Department of Energy. The Government has certain rights in the invention.

FIELD OF THE INVENTION

The present invention relates to semiconductors in general, and, more particularly, to fabrication of optical semiconductor devices.

BACKGROUND OF THE INVENTION

Solution-based roll-to-roll deposition techniques are widely considered to be a route to low-cost, high-throughput electronic- and energy-device fabrication. The ink and the deposition method must be carefully designed, however, to produce high-quality semiconductor devices—particularly in the case of solar cells and other optoelectronic semiconductor devices.

For solar cells, for example, it is particularly important that a deposition method be scalable. In addition, the ink should enable dense, thick layers that are without pinholes and result in minimal residual contamination. Further, it is preferable that the solution should be air-stable as well as environmentally friendly.

Several approaches for the fabrication of photovoltaic devices using inorganic nanocrystal inks have been reported in the prior art. $Cu_2S/CdS$ heterojunction solar cells having a photovoltaic conversion efficiency of 1.6% have been fabricated using nanoparticles and nanorods. The fabrication of $Cu_2ZnSnS_4$ solar cells and large-grained $CuInSe_2$ using sulfide nanocrystal inks has also been demonstrated. Further, nanocrystalline $CuInS_2$ solar cells with approximately 4% efficiency have been fabricated using an in-situ nanocrystal synthesis.

Conventional nanocrystal inks offer advantages over other approaches in that they can be dispersed in organic solvents for coating. Unfortunately, their encapsulating organic ligands can leave behind residues that hurt device performance. Furthermore, nanocrystal synthesis is often air-sensitive, requiring complicated techniques and equipment, such as Schlenk-line manifolds. It has been demonstrated, however, that large-grained Cu(In,Ga)Se2 with efficiencies of >10% can be made using spin-casting precursor inks based on hydrazine. While this is a very exciting approach, hydrazine is toxic and explosive, which makes this approach less desirable.

SUMMARY OF THE INVENTION

The present invention enables high-rate deposition of nanocrystal inks on a wide range of substrates. Embodiments of the present invention are well suited to the fabrication of: optoelectronic devices, such as solar cells, light-emitting diodes, photodetectors, field-emission displays; microsystems, such as nanotechnology devices, micromechanical devices; thin-film absorber layers and buffer layers for photovoltaic devices; and transparent conducting oxides for thin-film transistors.

An embodiment of the present invention comprises the formation of an air-stable nanocrystal ink suitable for deposition by ink rolling techniques. In some embodiments, the nanocrystal ink is a vulcanized polymeric ink that is air-stable and has low toxicity. In some embodiments, the nanocrystal ink is readily decomposable via heating.

In some embodiments, the nanocrystal ink comprises $CuInS_2$. In some embodiments, the nanocrystal ink comprises a different metal, such as zinc, tin, tellurium, selenium, and the like.

In some embodiments, a nanocrystal ink is deposited via a fast rolling process. In some embodiments, a nanocrystal ink is deposited via a fast rolling process.

In an illustrative embodiment, the nanocrystal ink is first formed by mixing sulfur, $Cu(acac)_2$, and $In(acac)_3$, wherein the sulfur and the two precursors are dissolved in pyridine. The mixture vulcanizes in solution (i.e., the acac reacts with the sulfur) to form a rubberlike polymer. This polymer is deposited on a molybdenum-coated glass substrate using a roller bar. After a heat treatment to burn off all organic materials in the deposited layer, an air-stable Cu—In—O oxide film remains on the substrate. This Cu—In—O layer is then converted to $CuInS_2$ by sulfurizing the layer in elemental sulfur at an elevated temperature.

In some embodiments, an optoelectronic device, such as a solar cell, is formed on a $CuInS_2$ layer, formed in accordance with the present invention.

An embodiment of the present invention comprises a method comprising: forming a first mixture by mixing sulfur, a first metal precursor, and a second metal precursor in an organic solvent to form a first mixture; vulcanizing the first mixture; forming a first layer of the first mixture on a substrate; enabling the removal of organic materials from the first layer; and sulfurizing the first layer.

BRIEF DESCRIPTION OF THE DRAWINGS

FIG. 4 depicts a vulcanization reaction in accordance with the illustrative embodiment of the present invention.

FIG. 5A depicts a schematic drawing of a cross-sectional view of substrate 100 during the formation of nascent layer 502 of ink 402 on contact layer 104.

FIG. 5B depicts a schematic drawing of a cross-sectional view of the bi-layer oxide structure of layer 506

FIG. 8 depicts scanning-electron micrographs of a cross-sectional view of a portion of the layers of a solar cell formed in accordance with the present invention.

FIG. 9 depicts a schematic drawing of a cross-sectional view of a solar cell in accordance with the illustrative embodiment of the present invention.

DETAILED DESCRIPTION

The present invention enables a process referred to herein as "air-stable ink rolling" (AIR). AIR employs a vulcanized polymeric ink that is easily decomposed and that can be deposited on a substrate using a fast rolling process. The ink is made from low-cost commercially available precursors with relatively low toxicity. The fast rolling process is capable of depositing uniform layers of the ink over large areas. It should be noted that the vulcanized ink can also be deposited using other high-volume deposition methods, such as doctor-blade coating, roll-to-roll transfer, ink-transfer, silk-screen deposition, and the like.

In accordance with the present invention, an air-stable, easily decomposable, vulcanized ink and deposition process are disclosed. The ink and deposition process produce uniform, dense, contaminant-free, large-grained $CuInS_2$ absorber layers from low-cost, commercially available precursors. Further, a solar cell fabricated using the ink is presented, as well as test data that demonstrates that solar cells fabricated in accordance with the present invention can have a short-circuit current density similar to those of the best $CuInS_2$ solar cells disclosed in the prior art.

It should be noted that the present invention enables the use of substantially any metal/acac precursor in the AIR process. As a result, the design space for a high-volume deposition method based on the AIR process includes the use of any of a large number of metals in the vulcanized polymeric ink. Metals suitable for use with acac precursors, in accordance with the present invention, include indium, zinc, copper, tin, tellurium, cadmium, selenium, and aluminum, among others. The present invention, therefore, enables a versatile AIR process that is widely applicable to many materials systems used in the fabrication of optoelectronic and electronic devices, including solar cells, transparent electrodes, thin-film transistors, and memories. Specifically, the present invention enables thin-film absorber layers and buffer layers for photovoltaic devices, and transparent conducting oxides for thin-film transistors.

In this Specification, an exemplary ink that is suitable for the formation of a $CuInS_2$ layer is described. The $CuInS_2$ layer is used as an absorber layer for an exemplary solar cell. The absorber layer is shown to be substantially flat, contaminant-free, and large-grained, enabling the solar cell to show an initial power efficiency of 2.15%. One skilled in the art will recognize, after reading this Specification, that the present invention can be generalized for the development of low-cost solar cells of other materials, as well as other optoelectronic devices. Further, embodiments of the present invention enable the formation of other thin-film absorber layers (e.g., $Cu_2ZnSnSe_2$, $Cu_2ZnSnS_2$, CIG(Se,S), etc.), buffer layers (e.g., ZnS, ZnO, $In_2S_3$, etc.), and transparent conducting oxides (e.g., ZnO, ITO, AZO, etc.).

Figure 1:
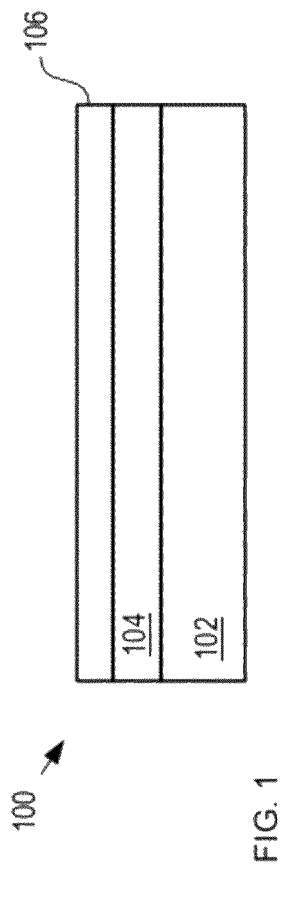
FIG. 1 depicts a schematic drawing of a cross-sectional view of a substrate comprising an absorber layer suitable for use in a solar cell in accordance with an illustrative embodiment of the present invention.

FIG. 1 depicts a schematic drawing of a cross-sectional view of a substrate comprising an absorber layer suitable for use in a solar cell in accordance with an illustrative embodiment of the present invention. Substrate 100 comprises handle wafer 102, contact layer 104, and absorber layer 106.

Handle wafer 102 is a conventional glass substrate. One skilled in the art will recognize that any substrate appropriate for optoelectronic and/or electronic device fabrication can be used for handle wafer 102. Although handle wafer 102 comprises glass, it will be clear to one skilled in the art, after reading this Specification, how to specify, make, and use alternative embodiments of the present invention wherein handle wafer 102 comprises a different material. Materials suitable for use in handle wafer 102 in embodiments of the present invention include, without limitation: rigid substrates of materials such as semiconductors, ceramics, glasses, metals (e.g., steel, tungsten, other refractory metals, etc.), plastics, epoxy resins, and the like; and flexible substrates of materials such as polyimide, polyether-ether-ketone (PEEK), polyester, other plastics, and the like. In some embodiments, substrate 102 comprises a release layer, such as sodium chloride, mica, silicon, and the like.

Contact layer 104 is a layer comprising molybdenum, which is commonly used for a lower contact layer in conventional solar cells or other optoelectronic devices. It should be noted that molybdenum is only one example of a suitable material for use in contact layer 104 in accordance with the present invention. Other materials suitable for use in contact layer 104 include, without limitation, platinum, gold, gold-beryllium, nickel, silver, copper, indium-tin oxide, zinc-oxide, aluminum-zinc-oxide, fluorine-doped tin oxide, and the like.

Figure 2:
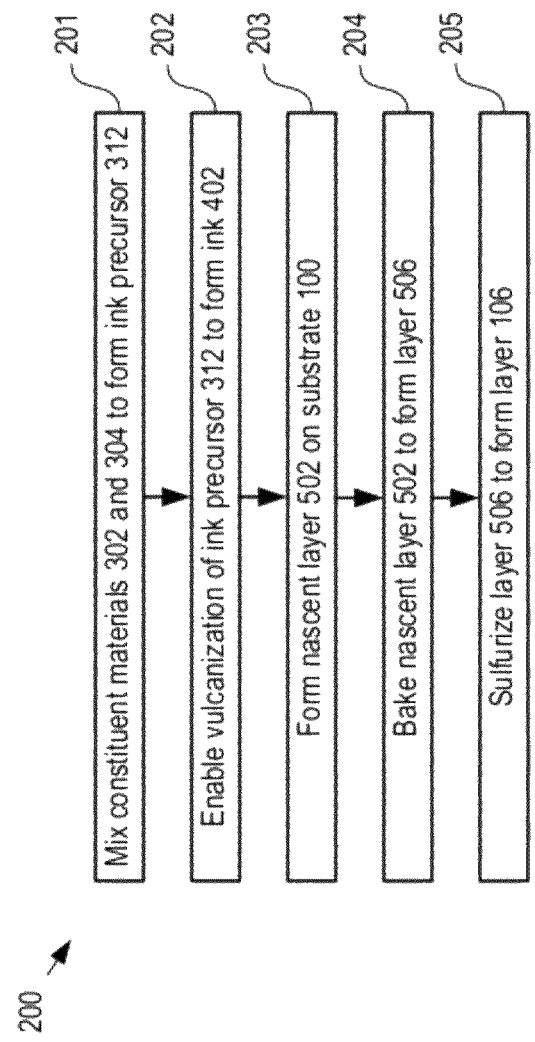
FIG. 2 depicts operations of a method suitable for forming an absorber layer on a substrate in accordance with the illustrative embodiment of the present invention.

FIG. 2 depicts operations of a method suitable for forming an absorber layer on a substrate in accordance with the illustrative embodiment of the present invention. Method 200 begins with operation 201, wherein a precursor of an ink suitable for forming an absorber layer comprising $CuInS_2$ is prepared. Method 200 is described with continuing reference to FIG. 1 as well as reference to FIGS. 3, 4, and 5A-B.

Figure 3:
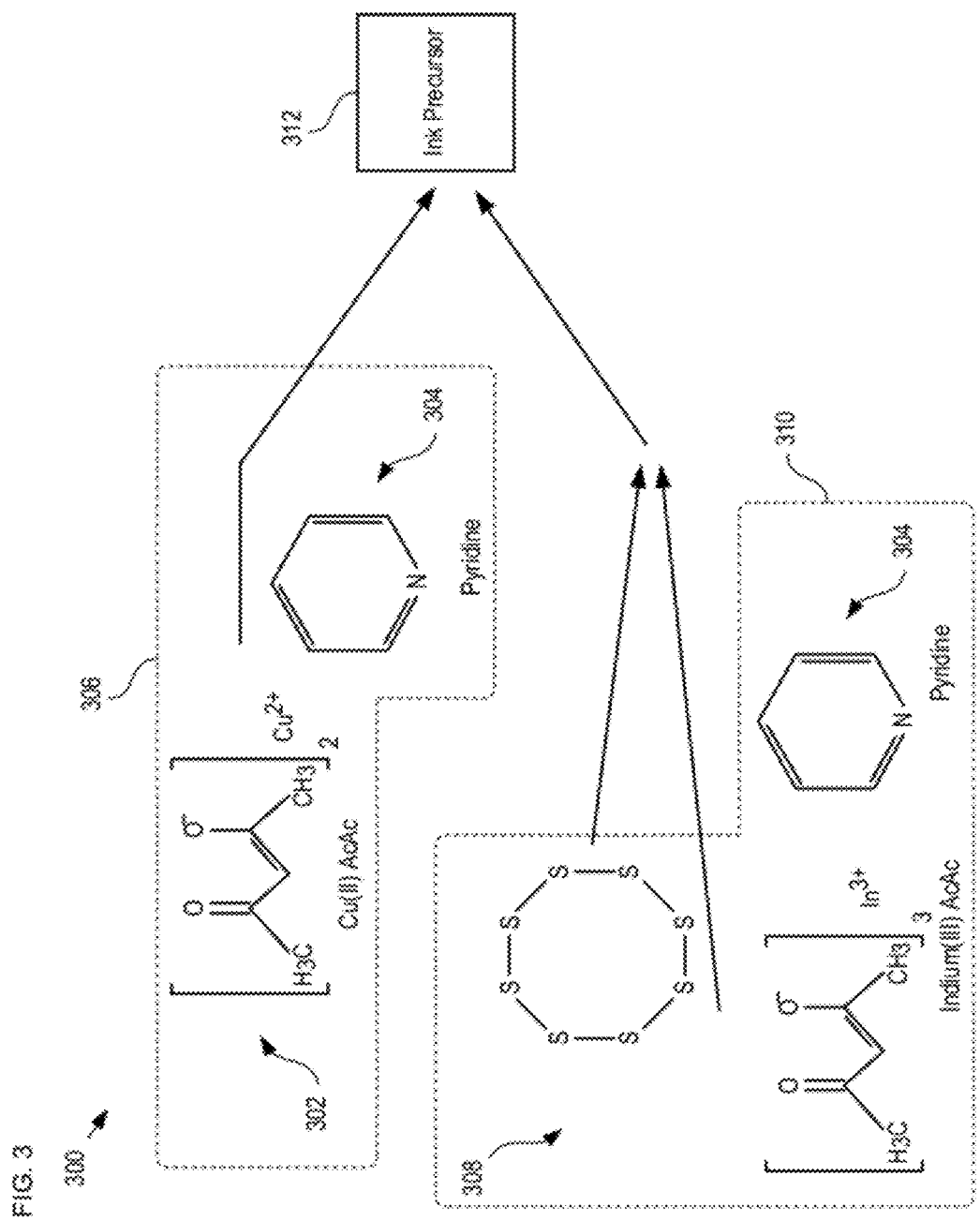
FIG. 3 depicts a process for synthesizing ink precursor 312 in accordance with the illustrative embodiment of the present invention.

FIG. 3 depicts a process for synthesizing ink precursor 312 in accordance with the illustrative embodiment of the present invention.

To form ink precursor 312, a first mixture 302 comprising $Cu(acac)_2$ is dissolved in solvent 304 (typically comprising pyridine) to form first solution 306. One skilled in the art will recognize that "acac" stands for acetylacetonate, which is only one suitable choice for use with the present invention. Other suitable materials include, without limitation, ketones, diketonates, ethanoates, and the like, which typically exhibit substantially similar reactivity as acac. A second mixture 308 comprising $In(acac)_3$ and elemental sulfur is then dissolved in solvent 304 to form second solution 310. First solution 306 and second solution 310 are then intermixed mixed via conventional mixing means, such as sonication, stirring, etc., to form ink precursor 312. Solvents suitable for use in ink precursor 312 include, without limitation, amine solvents having properties similar to pyridine, such as ethylenediamine, triethylamine, methylamine, ethylamine, and the like.

At operation 202, a reaction of the acac with the sulfur is enabled to vulcanize ink precursor 312 and form ink 402.

FIG. 4 depicts a vulcanization reaction in accordance with the illustrative embodiment of the present invention.

The vulcanization of ink precursor 312 is an important aspect of the present invention as it creates a rubberlike polymer that is a more durable and a more easily deposited material as compared to prior-art compositions, such as kesterite or chalcogenide compositions. This reaction of the acac with the sulfur serves to modify the polymer-based ink by forming crosslinks between individual polymer chains. In some embodiments, vulcanization of ink precursor 312 results in an ink comprising nanoparticles of Cu—In—S with a vulcanized ligand. For the purposes of this Specification, including the appended claims, the term "vulcanized ligand" is defined as the reaction product of a chalcogenide (e.g., sulfur, selenium, tellurium, etc.) with a group IIIA or IVA metal (e.g., indium, aluminum, strontium, lead, etc.) organometallic in an organic solvent.

In some embodiments, vulcanization of ink precursor 312 results in an ink comprising nanoparticles of Cu—In with a vulcanized ligand that includes substantially all of the In. In some embodiments, vulcanization of ink precursor 312 results in an ink comprising a vulcanized organometallic compound that includes copper, indium, and sulfur.

Prior to vulcanization, ink precursor 312 is relatively sticky and comprises monomeric units of dissolved organometallic compounds and freshly dissolved sulfur. As vulcanization of ink precursor 312 commences, short polymeric units form. As the vulcanization progresses, these short polymeric units crosslink and form a more viscous ink that comprises nanoparticles. After the formation of the crosslinked polymers and nanoparticles, the viscosity and wetting characteristics of ink 402 enable it to more readily coat a suitable substrate in a substantially uniform fashion.

One skilled in the art will recognize that, after operation 202, ink 402 can be in the form of a liquid or a paste.

It should be noted that the vulcanization of ink 402 is a reaction, in contrast to prior-art methods of controlling the viscosity, etc., of a nanoparticle mixtures, such as adding one or more of binders, emulsifiers, thickening agents, plasticizers, and preservatives to the mixture, as described in U.S. Pat. No. 8,048,477, "Chalcogenide Solar Cells," issued Nov. 1, 2011. Further, embodiments of the present invention do not require the synthesis or acquisition of nanoparticles having a proper composition, such as is required in prior-art methods described in, for example, in U.S. Pat. No. 8,048,477, U.S. Pat. No. 8,026,124, "Method for Fabricating Copper/Indium/Gallium/Selenium Solar Cell by Wet Process Under Non-Vacuum Conditions," issued Sep. 27, 2011, U.S. Pat. No. 7,663,057, "Solution-based Fabrication of Photovoltaic Cell," issued Feb. 16, 2010, and U.S. Patent Publication No. 2011/0287573, "Atypical Kesterite Compositions," published Nov. 24, 2011.

It should also be noted that embodiments of the present invention use sulfur as a reactant to form both nanoparticles and ligands in a single operation, in contrast with prior-art methods wherein sulfur is used as a reactant to form only one of nanoparticles or ligands at a time. As a result, embodiments of the present invention enable the formation of an absorber layer with less complexity, fewer operations, and lower cost.

It is an aspect of the present invention, therefore, that the formulation of ink 402 is derived via the use of sulfur as a reactant in a reaction that forms:
  i. an active dispersant; or
  ii. a ligand; or
  iii. a surfactant; or
  iv. any combination of i, ii, and iii.

At operation 203, a nascent layer of ink 402 is formed on contact layer 104.

FIG. 5A depicts a schematic drawing of a cross-sectional view of substrate 100 during the formation of nascent layer 502 of ink 402 on contact layer 104.

At operation 203, ink 402 is applied to the top surface of contact layer 104 and formed into nascent layer 502. The deposited ink is formed into nascent layer 502 by rolling ink 402 onto contact layer 104 using roller bar 504. The intrinsic roughness of roller bar 504 allows it to coat the substrate in a manner similar to a Mayer rod, resulting in a substantially uniform wet film. FIG. 5A depicts nascent layer 502 as partially formed during operation 203.

Although nascent layer 502 is formed via a roller bar in the illustrative embodiment, it will be clear to one skilled in the art, after reading this Specification, how to specify, make, and use alternative embodiments of the present invention wherein nascent layer 502 is formed by another suitable process. Processes suitable for forming nascent layer 502 include, without limitation, doctor-blade coating, spray coating, roll-to-roll transfer, spin coating, contact printing, slot-die coating, ink-jet printing, and the like.

At operation 204, nascent layer 502 is baked in air on a hot plate at 370° C. to drive off organic materials and form layer 506. After operation 205, layer 506 is a substantially air-stable Cu—In oxide (Cu—In—O) film that is substantially free of ink residue.

Operations 203 and 204 result in layer 506 having a thickness within the range of approximately 100 nanometers (nm) to approximately 500 nm. In the example provided here, after operations 203 and 204, layer 506 is a layer of Cu—In—O having a thickness of approximately 400 nm, where layer 506 comprises a bi-layer of oxides. One skilled in the art will recognize, after reading this Specification, that operations 203 and 204 can be repeated as many times as desired to produce any practical final thickness.

It should be noted that, in some embodiments of the present invention, contact layer 104 is not included and layer 506 is disposed directly on an electrically conductive substrate. Further, in some embodiments, layer 506 is disposed on a release layer instead of contact layer 104.

Efficient $CuInS_2$-based devices require dense films having minimal contamination (e.g., from carbon). Furthermore, an ideal absorber layer would have a columnar grain structure to aid carrier collection.

Figure 6:
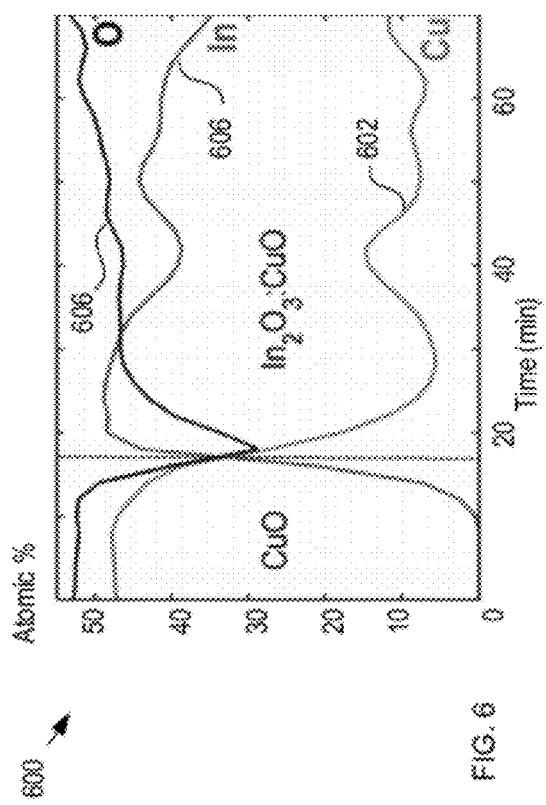
FIG. 6 shows the results of auger electron spectroscopy analysis of layer 506 after operation 204.

FIG. 6 shows the results of auger electron spectroscopy analysis of layer 506 after operation 204. Plot 600 is an elemental depth profile of layer 506 comprising trace 602, which corresponds to the atomic percent of copper, trace 604, which corresponds to the atomic percent of oxygen, and trace 606, which corresponds to the atomic percent of indium. Plot 600 demonstrates that ink 402 substantially decomposes into a bi-layer of oxide layers 508 and 510 during operation 204, wherein the top oxide layer 510 is nearly exclusively copper-oxide (CuO) and bottom layer 508 is a mixture of CuO and $In_2O_3$.

FIG. 5B depicts a schematic drawing of a cross-sectional view of the bi-layer oxide structure of layer 506.

The bi-layer structure is believed to result from a higher diffusion rate for copper than indium ions during the oxidation process, or, alternatively, a lower decomposition temperature of $Cu(acac)_2$ in comparison with $In(acac)_3$.

Notably, the auger analysis detected no presence of sulfur, which appears to have been completely removed during operation 204. This suggests the easy decomposition of the vulcanized sulfur polymer. In addition, the auger analysis detected no presence of carbon after operation 204. Carbon is believed to be a major undesirable impurity in solution-processed solar cells; therefore, its absence from layer 506 potentially affords embodiments of the present invention great advantage over the prior art.

Careful examination of plot 600 reveals that the decomposition/oxidation products are gaseous and are completely removed in operation 204.

It should be noted that the bi-layer oxide structure of layer 506 (i.e., oxide layers 508 and 510) has utility in many device compositions in diverse applications. For example, layer 506 can form the basis of: thermochromic systems, such as temperature-sensitive prints, polymers, and liquid crystals; electrochromic systems, such as smart windows and mirrors; catalytic systems; optical devices; and the like.

At operation 205, bi-layer oxide layer 506 is converted to a substantially homogeneous layer of $CuInS_2$ to form absorber layer 106. Conversion of the bi-layer oxide layer into $CuInS_2$ is induced by sulfurization of the oxides using elemental sulfur in a bomb at a temperature within the range of approximately 500° C. to approximately 550° C.

Figure 7:
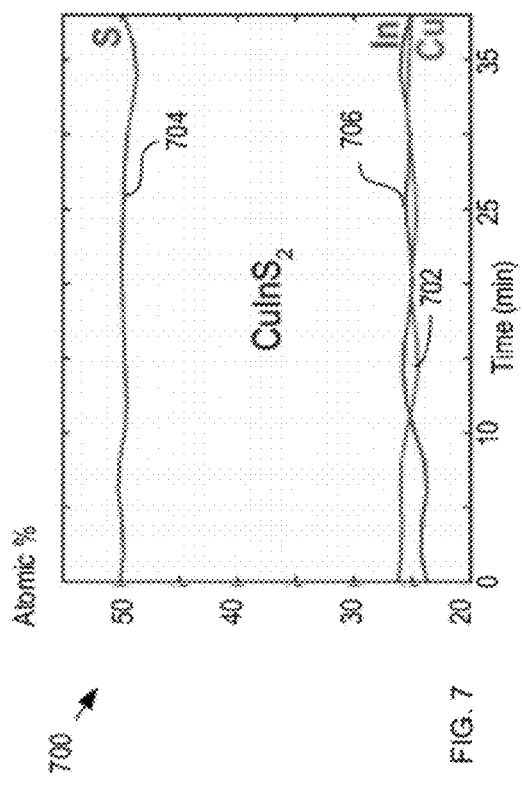
FIG. 7 shows the results of an auger electron spectroscopy analysis of absorber layer 106 after operation 205.

FIG. 7 shows the results of an auger electron spectroscopy analysis of absorber layer 106 after operation 205. Plot 700 shows an elemental depth profile of absorber layer 106 comprising trace 702, which corresponds to the atomic percent of copper, trace 704, which corresponds to the atomic percent of sulfur, and trace 706, which corresponds to the atomic percent of indium.

Plot 700 demonstrates a substantially complete conversion of the bi-layer oxide film of layer 506 into homogeneous absorber layer 106, forming a uniform and dense layer of $CuInS_2$ that is substantially free of carbon and other impurities. The formation of tetragonal $CuInS_2$ during operation 205 was also confirmed by X-ray diffraction.

It is a key aspect of the present invention that the AIR process, based on vulcanized ink 402, produced large-grained $CuInS_2$ in absorber layer 106 when it was formed by sulfurization of the oxides in layer 506.

FIG. 8 depicts scanning-electron micrographs of a cross-sectional view of a portion of the layers of a solar cell formed in accordance with the present invention. Image 802 shows a cross-sectional view of contact layer 104 and absorber layer 106 of solar cell 800, as well as a portion of a CdS/ZnO top contact layer. Image 804 (inset) shows a top view of layer 106 of the solar cell. Image 804 clearly shows that grains extended across the entire thickness of layer 106.

Previous attempts to achieve grain growth in nanocrystalline $CuInS_2$ at high temperature in sulfur atmospheres have generally not been successful. As a result, it is speculated herein that the intermediate oxide precursors in layer 106 appear to be important for the growth of large grains.

In addition to enabling a high-quality layer of $CuInS_2$, the present invention affords additional advantages. Notably, in some embodiments, operation 205 results in a layer that has low density and is at least slightly porous. These characteristics are inferred from several factors. First, full transformation of the oxide of bi-layer oxide layer 506 into the sulfide of absorber layer 106 occurs at a temperature within the range of 500-550° C. over a period of 5-30 minutes, which are lower values than would be expected based on published data, such as reported by T. Wada in "Preparation of $CuInS_2$ films by sulfurization of Cu—In—O films," *Applied Physics Letters*, Vol. 62, No. 16, pp. 1943-1945 (1993). Second, it is anticipated that the oxidation and removal of carbon/sulfur residue during operation 205 must leave spaces within the structure of absorber layer 106. Third, the copper and indium in bi-layer oxide layer 506 undergo migration to form the In—O/Cu—O layer stack, which suggests that a tightly packed $Cu_2In_2O_5$ structure was not present.

While a less dense and more porous final form of absorber layer 106 would not be considered an advantage in some compositions, such as in a solar cell structure, higher porosity intermediate states of the layer enable faster reactions due to a higher surface area/volume ratio that allows more solid/gas interaction. Further, in some embodiments of the present invention (e.g., embodiments directed toward non-solar cell applications, such as reaction catalyst layers of $MoS_2$, etc.), high porosity is highly desirable since it enables increased reaction rate. In some embodiments, absorber layer 106 can be used as a bare sulfide to, for example, act as a reaction catalyst.

Solar Cell Fabrication

FIG. 9 depicts a schematic drawing of a cross-sectional view of a solar cell in accordance with the illustrative embodiment of the present invention. Solar cell 900 comprises substrate 102, contact layer 104, absorber layer 902, buffer layer 904, top contact layer 906, and contact 908.

Absorber layer 902 is analogous to absorber layer 106, described above and with respect to FIG. 1. Absorber layer 902, however, has a thickness approximately equal to 1.5 microns.

Figure 10:
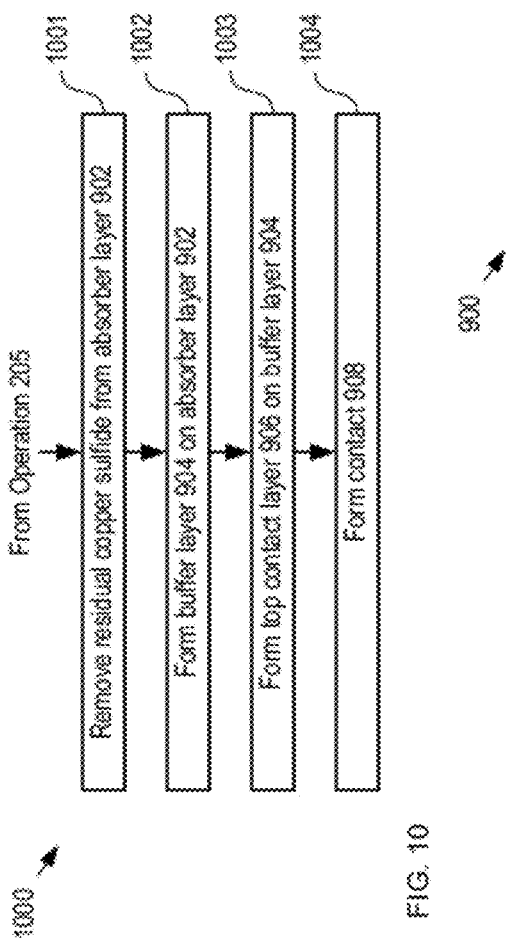
FIG. 10 depicts operations of a method suitable for forming a solar cell in accordance with the illustrative embodiment of the present invention.

FIG. 10 depicts operations of a method suitable for forming a solar cell in accordance with the illustrative embodiment of the present invention. Method 1000 begins with optional operation 1001, wherein absorber layer 902 is etched to remove residual copper sulfide. An etchant suitable for this purpose is 0.5 M KCN for 10 min, although other etchants will be apparent to one skilled in the art. Residual copper sulfide is known to be produced easily during $CuInS_2$ film formation and can cause shunting in solar cells or other optoelectronic devices, such as photodiodes. It is preferable, therefore, to include operation 801 in the fabrication of an optoelectronic device, such as a solar cell.

At operation 1002, buffer layer 904 is formed on absorber layer 902. Buffer layer 904 is an n-type CdS buffer layer that can be deposited, for example, by chemical bath deposition.

At operation 1003, top contact layer 906 is formed on buffer layer 904. Top contact layer 906 is a layer of ZnO deposited, for example, by reactive DC magnetron sputtering. Layers 904 and 906 have a combined thickness of approximately 0.2 micron.

At operation 1004, contact 908 is formed on top contact layer 906 to complete the fabrication of solar cell 900. Contact 908 is a layer of indium tin oxide (ITO) having substantially square area of approximately 1 mm on a side. Contact 908 is formed by deposition of ITO through a suitable shadow mask. Contact 908 defines the device area of solar cell 900.

Figure 11:
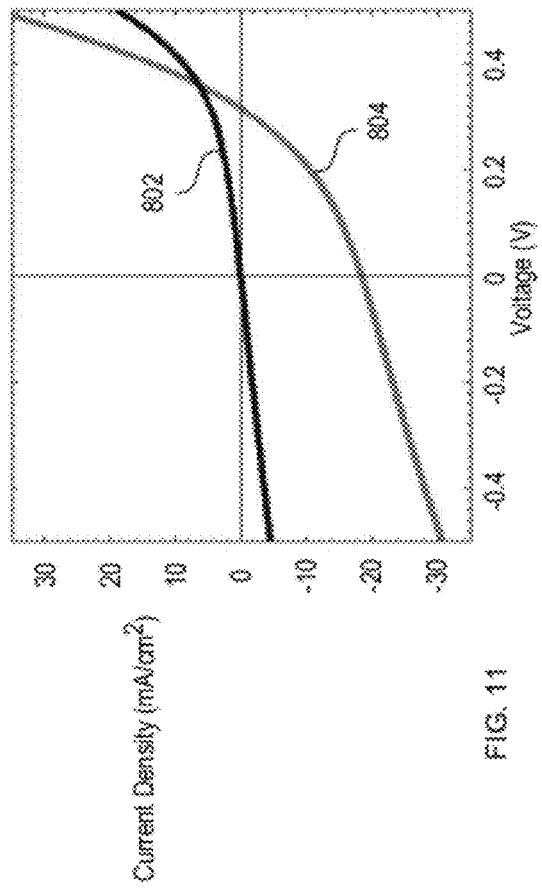
FIG. 11 shows plots of current-voltage measurements for solar cell 900.

FIG. 11 shows plots of current-voltage measurements for solar cell 900. Plot 902 shows data for current density versus voltage for solar cell 900 under no illumination. Plot 904 shows data for current density versus voltage for solar cell 900 at an illumination of 100 mW/cm². For this device, the short-circuit current density, $J_{sc}$, was 18.49 mA/cm2, which is comparable to high efficiency $CuInS_2$ solar cells demonstrated in the prior art. The power conversion efficiency, η, in this device was 2.15%. The fill factor of 36% and open-circuit voltage, Voc, of 320 mV is not high, most likely because of the low shunt-resistance. One potential cause for low shunt-resistance is film cracking induced by mechanical stresses created during sulfurization, which is known to produce structural and volumetric changes.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A method comprising:
    enabling vulcanization of an ink precursor, the ink precursor comprising sulfur, a first precursor comprising a first metal, and a second precursor comprising a second metal, wherein the sulfur, first precursor, and second precursor are dissolved in an organic solvent, and wherein the vulcanization of the ink precursor forms a first ink that comprises nanoparticles and a vulcanized ligand, the nanoparticles comprising copper and sulfur;
forming a first layer of the first ink on a substrate; and
enabling removal of organic materials from the first layer.

2. The method of claim 1 further comprising sulfurizing the first layer.

3. The method of claim 1 further comprising forming a buffer layer, wherein the buffer layer is disposed on the first layer.

4. The method of claim 3 wherein the buffer layer comprises cadmium sulfide.

5. The method of claim 3 further comprising forming a second layer disposed on the buffer layer, wherein second layer and the buffer layer collectively define at least a portion of an optoelectronic device structure.

6. The method of claim 5 wherein the second layer comprises zinc-oxide.

7. The method of claim 3 further comprising etching the first layer to remove a portion of the first layer.

8. The method of claim 1 further comprising providing the first precursor such that it comprises copper (Cu) and acetylacetonate (acac).

9. The method of claim 1 further comprising providing the first precursor such that it comprises Cu(acac)$_2$.

10. The method of claim 1 further comprising providing the second precursor such that it comprises indium (In) and acac.

11. The method of claim 1 further comprising providing the second precursor such that it comprises In(acac)$_3$.

12. The method of claim 1 wherein each of the nanoparticles further comprises indium.

13. The method of claim 1 further comprising:
providing the first precursor such that it comprises Cu(acac)$_2$; and
providing the second precursor such that it comprises In(acac)$_3$.

14. The method of claim 1 wherein the removal of organic materials from the first layer is enabled by baking the substrate at a temperature greater than 80° C.

15. The method of claim 1 wherein the removal of organic materials from the first layer is enabled by baking the substrate at a temperature greater than 300° C.

16. The method of claim 1 wherein the removal of organic materials from the first layer is enabled by baking the substrate at a temperature of approximately 370° C.

17. The method of claim 1 wherein the first layer is formed by depositing the first ink on the substrate via a deposition method selected from the group consisting of ink rolling, doctor-blade coating, wire coating, silk screening, spray coating, roll-to-roll transfer, and spin coating.

18. The method of claim 1 further comprising forming a plurality of layers disposed on the first layer, wherein the plurality of layers collectively define an optoelectronic device structure.

19. The method of claim 18 wherein the plurality of layers are disposed such that they collectively define a solar cell structure.

20. The method of claim 18 wherein the plurality of layers are disposed such that they collectively define a light-emitting diode structure.

21. The method of claim 18 wherein the plurality of layers are disposed such that they collectively define a photodiode structure.

22. A method comprising:
mixing sulfur, Cu(acac)$_2$, and In(acac)$_3$ in pyridine to form a first mixture;
vulcanizing the first mixture to provide a vulcanized ink comprising nanoparticles and a vulcanized ligand, the nanoparticles comprising copper and sulfur;
forming a first layer of the vulcanized ink on a substrate;
removing organic solvent from the first mixture by heating the first layer to a temperature within the range of approximately 250° C. to approximately 450° C.; and
sulfurizing the first layer.

23. The method of claim 22 further comprising the substrate, wherein the substrate comprises a second layer comprising molybdenum, and wherein the first layer is formed on a surface of the second layer.

24. The method of claim 22 wherein the first layer is sulfurized by exposing the first layer to elemental sulfur at a temperature within the range of approximately 400° C. to approximately 550° C.

25. The method of claim 24 wherein the first layer is exposed to elemental sulfur at a temperature of approximately 525° C.

26. The method of claim 22 wherein the organic solvent is removed from the first layer by heating the first layer to a temperature of approximately 370° C.

* * * * *